(12) United States Patent
Gupta et al.

(10) Patent No.: US 7,768,299 B2
(45) Date of Patent: Aug. 3, 2010

(54) VOLTAGE TOLERANT FLOATING N-WELL CIRCUIT

(75) Inventors: Abheek Gupta, San Diego, CA (US); Vaishnav Srinivas, San Diego, CA (US); Vivek Mohan, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/832,128

(22) Filed: Aug. 1, 2007

(65) Prior Publication Data

US 2009/0033400 A1   Feb. 5, 2009

(51) Int. Cl.
*H03K 19/0175* (2006.01)
(52) U.S. Cl. .................... 326/38; 326/57; 327/534
(58) Field of Classification Search ............. 326/56–58, 326/82, 83, 86, 87; 327/534, 535, 537
See application file for complete search history.

(56) References Cited

U.S. PATENT DOCUMENTS

| | | | |
|---|---|---|---|
| 5,936,456 A | * | 8/1999 | Naka ........................... 327/437 |
| 5,963,055 A | * | 10/1999 | Tanaka et al. ................. 326/81 |
| 6,043,681 A | | 3/2000 | Lim |
| 6,060,906 A | | 5/2000 | Chow et al. |
| 2005/0017754 A1 | * | 1/2005 | Ker et al. ...................... 326/81 |

OTHER PUBLICATIONS

International Search Report - PCT/US08/071494, International Searching Authority - European Patent Office, Jan. 22, 2009.
Written Opinion - PCT/US08/071494, International Searching Authority - European Patent Office, Jan. 22, 2009.

* cited by examiner

*Primary Examiner*—Rexford N Barnie
*Assistant Examiner*—Jany Tran
(74) *Attorney, Agent, or Firm*—Donald C. Kordich; William M. Hooks

(57) ABSTRACT

Methods and apparatuses are presented for voltage tolerant floating N-well circuits. An apparatus for mitigating leakage currents caused by input voltages is presented which includes a first transistor having a source coupled to a positive voltage supply, and a drain coupled to a floating node. The apparatus may further include a controllable pull-down path coupled to a negative voltage supply and the first transistor, wherein the controllable pull-down path is configured to turn on the first transistor and pull-up the floating node during a first state. The apparatus may further include a second transistor having a source coupled to a gate of the first transistor, and drain coupled to the floating node, wherein the second transistor is configured to place the floating node at a floating potential during a second state.

21 Claims, 4 Drawing Sheets

VOLTAGE TOLERANT FLOATING N-WELL CIRCUIT

FIELD OF DISCLOSURE

The embodiments of the disclosure relate generally to interface circuits, and more specifically, input/output interface circuits capable of accepting input signals having voltages which are higher than the voltage levels of the interface circuits' voltage supply.

BACKGROUND

An input/output (IPO) circuit within a particular device may serve as an electrical interface between the device's internal circuitry and the external circuitry belonging to other devices. The I/O circuits may serve to exchange (transmit and/or receive) voltage signals between the internal and external circuitry. Such IPO circuits may also be used to provide electrical isolation between the internal circuitry and the external circuitry, and may be especially useful when the internal circuitry operates at different voltages than the external circuitry. For example, the internal circuitry may include an integrated circuit core which may function at lower voltages, and the external circuitry may be part of a peripheral device which may function at higher voltages. In this situation, the I/O circuit can serve to protect the circuit core from the higher voltages generated by the peripheral device.

The I/O circuit may operate using a positive voltage supply and a negative voltage supply. In general, these supplies may represent the most positive and most negative voltages generated within the I/O circuit itself. In some situations, the negative supply may simply be at ground potential (i.e., the negative supply may be designated as zero volts).

When in output mode, the I/O circuit may be providing output signals to the external circuit. The voltage values of the output signals may be bounded by the voltages produced by the I/O circuit's voltage supplies. During input mode, the I/O circuit is receiving input signals from the external circuit. For conventional I/O circuits, the input signals should be limited to the values capable of being produced by the voltage supplies for reliable operation. If the input voltages are not so limited (hereinafter defined as "exceeding voltage input signals"), components within the I/O circuit may become electrically over-stressed. Specifically, exceeding voltage input signals may lead to undesirable leakage currents through transistors used in the I/O circuit, and can further lead to a variety of breakdown phenomena, including oxide breakdown, hot carrier injection, negative bias temperature instability, and junction breakdown.

In some situations, the IPO circuit may not be able to avoid receiving exceeding voltage input signals as the input signal's amplitude is controlled by the external circuit. In order for a device to interface to a wide variety of peripherals, it may be desirable to design I/O circuits with the capability to receive exceeding voltages (within practical limits) without any detrimental effects. I/O circuits having this capability may be defined as being "voltage tolerant."

Accordingly, there is a need for voltage tolerant IPO circuits which may accept exceeding voltage input signals from external circuits which minimize leakage currents and improve reliability, performance, and power efficiency.

SUMMARY

Exemplary embodiments of the invention are directed to circuits and methods for voltage tolerant floating N-well circuits.

One embodiment of the invention can include an apparatus for mitigating leakage currents caused by input signals within a driver circuit. The apparatus may include a means for receiving an input signal voltage, a means for isolating a voltage supply from leakage currents passing through a drain-source connection of a transistor within a driver circuit when an input signal voltage exceeds a supply voltage, and a means for isolating leakage currents passing through drain-bulk connections of a plurality of transistors within the I/O device when the input voltage exceeds the supply voltage.

Another embodiment of the invention may include an apparatus for mitigating leakage currents caused by input voltages. The apparatus may include a first transistor having a source coupled to a positive voltage supply, and a drain coupled to a floating node, a controllable pull-down path coupled to a negative voltage supply and the first transistor, wherein the controllable pull-down path is configured to turn on the first transistor and pull-up the floating node during a first state, and a second transistor having a source line coupled to a gate of the first transistor, and a drain coupled to the floating node, wherein the second transistor is configured to place the floating node at a floating potential during a second state.

Another embodiment can include a method for mitigating leakage currents caused by an input voltage at an input/output (I/O) node that exceeds the supply voltage in an I/O device. The method can comprise receiving a control signal having a first level corresponding to an input state and a second level corresponding to an output state; applying the control signal to a first leakage path inhibitor to isolate the voltage supply from leakage currents passing through a drain-source connection of a transistor within the driver circuit; and applying the control signal to a second leakage path inhibitor to isolate leakage currents passing through the drain-bulk connections of a plurality of transistors in the I/O device.

Yet another embodiment of the invention may include an interface circuit capable of accepting an input voltage exceeding a voltage supply. The interface circuit may include a driver circuit having an input/output (I/O) node for receiving and transmitting signals, a first leakage path inhibitor coupled to a source of a p-channel transistor within the driver circuit; and a second leakage path inhibitor coupled to a bulk of the p-channel transistor within the driver circuit.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. The term "reliability" is used herein to denote the capability of a device to operate without degraded performance over an expected lifetime of the device. The term "float" may be used herein to designate that a particular portion of a circuit is not tied to any particular voltage value. So when a "node floats," or when a portion of a circuit is described as a "floating node," it means that the voltage value of that node is not fixed by any voltage supply, and is free to change.

Figure 1:
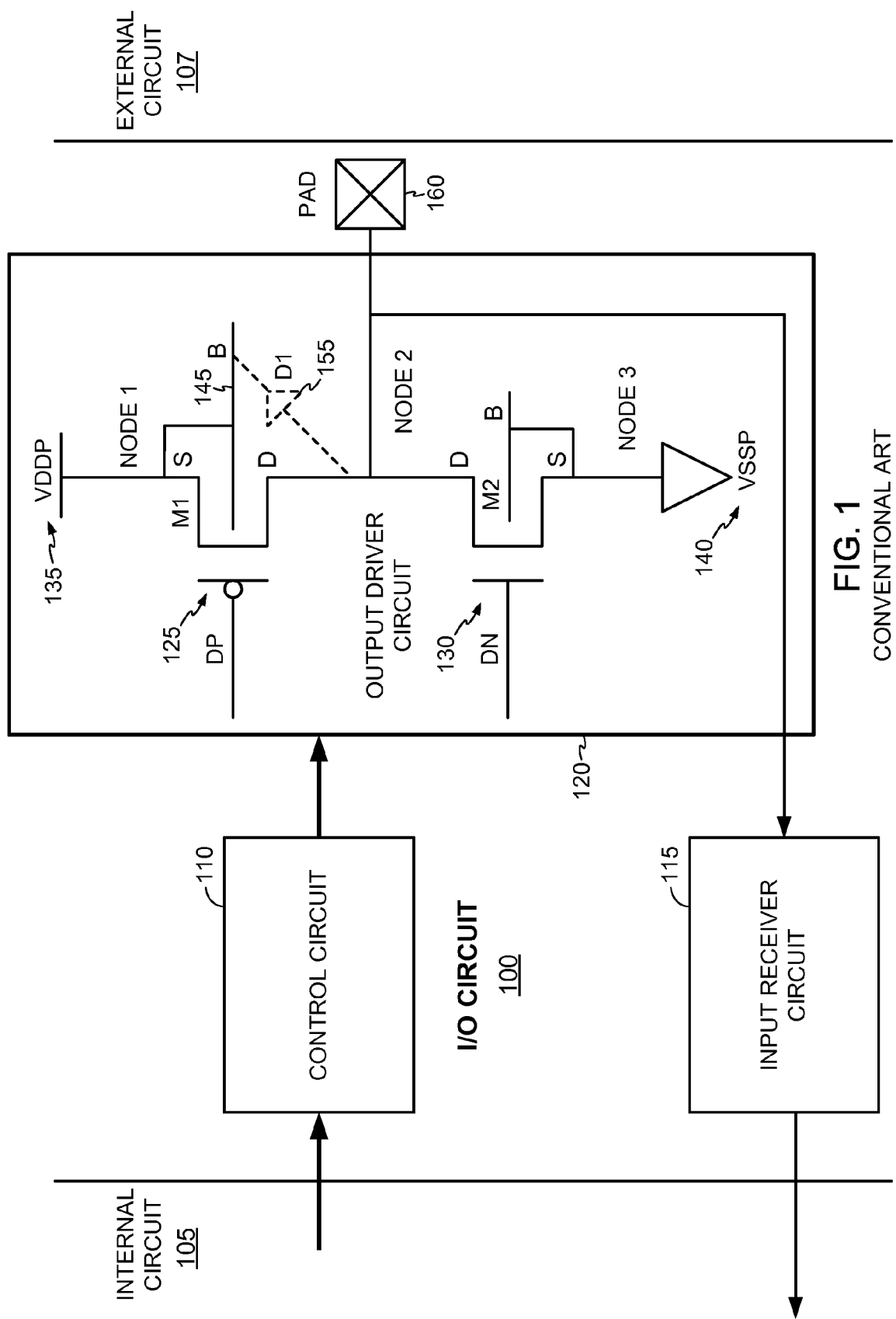
FIG. 1 is a schematic diagram depicting a conventional input/output (I/O) interface circuit.

FIG. 1 is a schematic diagram depicting a conventional input/output (I/O) circuit 100. The I/O circuit 100 may act as an electrical interface between an internal circuit 105 and an external circuit 107. The I/O circuit's 100 function may include reliably transmitting signals from the internal circuit 105 to the external circuit 107, and providing signals received from the external circuit 107 to the internal circuit 105. The internal circuit 105 may represent, for example, a chip core, and can operate at lower voltages (e.g., nominal chip core voltage supplies may be approximately 1.1 volts). The I/O circuit 100 may typically operate at voltages higher than the internal circuit 105 (e.g., nominal I/O circuit voltage supplies may be approximately 2.5 volts). The external circuit 107 may represent, for example, a peripheral device, and may operate at voltages which can be higher than the I/O circuit 100 and the internal circuit 105 (e.g., voltage supplies of 3.3 Volts).

The I/O circuit 100 can operate in two modes, input mode and output mode. During output mode, internal circuit 105 may be configured to pass information to the external circuit 107 using voltage signals having discrete levels. The internal circuit 105 passes the digital information to control circuit 110. The control circuit 110 may perform logical operations on the information to generate appropriate control signals. Based upon the input provided by the internal circuit 105, the control circuit 110 can generate the control signals DP and DN which are passed to the driver circuit 120. Based upon the voltage levels of DP and DN, driver circuit 120 may generate an output signal which encodes information using discrete voltage levels. For example, the output signal may have a high voltage level represent a "1" and a low voltage level represents a "0". The output signal may be passed onto the external circuit 107 to convey the information to the external device. When the I/O circuit 100 is in output mode, the levels of the output signals provided over I/O node 160 are bounded by the voltage supply levels (e.g., VDDP and VSSP) within the driver circuit 120.

During input mode, the control circuit 110 may hold the values of DP and DN at fixed levels to prepare the driver circuit 120 to block input signals. The input signals may be provided by the external circuit 107 to the I/O circuit 100 over the I/O node 160. The input signals may encode digital information in the form of discrete voltage levels. For example, the input signals may have a high voltage level representing a "1" and a low voltage level representing a "0". The input signals may be passed to an input receiver circuit 115 which may condition the input signal prior to passing it on to the internal circuit 105. Because the levels of the input signals may be controlled by the external circuit 107, the voltages of these signals are not bounded by the power supplies of the driver circuit 120. In some cases, depending upon the design of the external circuit 107, the voltage levels of the input signals may exceed the voltages produced by the driver circuit's 120 power supplies. Such signals, termed herein as "exceeding voltage input signals", may cause one or more different types of leakage currents to enter a power supply of the driver circuit 120. Presented below is a more detailed description of the components of the driver circuit 120, which may be used to better understand the nature of the various leakage currents.

Further referring to FIG. 1, when the conventional I/O circuit 100 is in input mode and receives an exceeding voltage input signal from the external circuit 107, two different types of leakage paths may permit current to enter into the driver circuit's positive voltage supply (VDDP) 135. The first leakage path may be formed through the drain-source connection of a p-channel transistor 125, and the second leakage path may be formed through the drain-bulk connection of the p-channel transistor 125. The p-channel transistor may be a p-channel field effect transistor (pFET), and, more specifically, it may also be a p-channel Metallic Oxide Semiconductor Field Effect transistor (pMOSFET). As shown in FIG. 1, the source node S and bulk node B of the p-channel transistor 125 are connected to the positive voltage supply 135, and may be at VDDP volts. The drain node D of the p-channel transistor is coupled to the I/O node 160.

With respect to the first leakage path, when the I/O circuit 100 is in input mode, the control circuit 110 may set the voltage level of the control signal DP equal to VDDP (the value of the positive voltage supply 135), and set the voltage level of control signal DN to VSSP (the value of negative voltage supply 140). This may place the p-channel transistor 125 and the n-channel transistor 130 in a non-conducting, or "off," state because the gate-source voltage across each transistor is zero. When an exceeding voltage input signal is presented at the I/O node 160, the voltage at the I/O node can exceed the voltage value VDDP of the positive voltage supply 135. One may consider this as having the effect of interchanging the source S and drain D nodes of p-channel transistor 125, thus creating a negative gate-source voltage. Because the input signal is an exceeding voltage input signal (its voltage exceeds VDDP), the gate-source voltage may exceed the threshold voltage of the p-channel transistor 125, thus placing the p-channel transistor in the conductive state ("on") state. For example, VDDP may be as low as 2.5 volts, and the exceeding voltage input signal at I/O node 160 may be 3.3 volts. These values may present a gate-source voltage difference at p-channel transistor 125 of −0.8 volts, which may be sufficient to exceed the threshold voltage of the p-channel transistor 125, thus turning the transistor on. When the p-channel transistor 125 turns on, a conductive leakage path is formed through the drain-source connection and current will flow through transistor 125 from the I/O node into the positive voltage supply 135. This leakage current may be undesirable as it may interfere with the positive voltage supply 135 and stress the voltage supply of the external circuit 107.

The second leakage path also may occur when the I/O circuit 100 is in the input mode and an exceeding voltage input signal is presented at the I/O node 160. In this case, a p-n drain-bulk diode 155, which is part of the p-channel transistor and not a separate component (hence being shown using a dotted line), becomes forward biased. Typically in the normal operation of the p-channel transistor 125, the drain-bulk diode 155 is reversed biased. However, the exceeding voltage input signal at I/O node 160 may raise the drain node voltage of the p-channel transistor 125 to a point where the drain-bulk diode becomes forward biased. For example, the exceeding voltage input signal may place the voltage of the drain node D of the p-channel transistor 125 at 3.3 volts. Because the bulk nodes of p-channel transistors are normally tied to the positive supply voltage, the bulk node B 145 of p-channel transistor 125 may be at VDDP volts, which may be, for example, approximately 2.5 volts. In this case, the voltage across the drain-bulk diode is +0.8 volts, which can be higher than a nominal diode turn-on voltage (e.g., 0.5 volts). This forward bias condition of the drain-bulk diode 155 may create a second conductive leakage path where an undesirable current may enter positive voltage supply 135.

Further referring to regular operation of the I/O circuit 100 in FIG. 1, during the output mode, the p-channel transistor 125 may supply a higher level voltage to drive the I/O node 160 high, and the n-channel transistor 130 may supply a lower level voltage to drive the I/O node 160 low. The drain-bulk diode 155 may be in a reverse-biased state since the bulk node B of p-channel transistor 125 is tied to VDDP, and the I/O node 160 may not be expected to go higher than VDDP. The source node S of the p-channel transistor 125 is also tied to VDDP, and the drain node D is coupled to the I/O node 160. The source node S of the n-channel transistor 130 may be connected to the negative voltage supply 140 and is therefore tied to VSSP volts. The drain node D of the n-channel transistor 130 may be connected to the I/O node 160. During output mode, the control signals DP and DN may both be assigned the voltage value VSSP by control circuit 110 to drive the I/O node 160 high. Alternatively, the control signals DP and DN may be assigned the voltage value VDDP to drive the I/O node 160 to a low voltage. Therefore, during output mode, the voltage values appearing at the I/O node 160 may not exceed the VDDP volts as supplied by the positive voltage supply 135, and thus leakage paths may not form through either the drain-source connection or the drain-bulk connection of the p-channel transistor 125 while in the output mode.

In order to avoid the aforementioned leakage paths occurring when exceeding voltage input signals are applied to I/O node 160 during input mode, circuit topologies are presented below to provide I/O circuits with the ability to tolerate exceeding voltages. Such I/O circuits are hereinafter defined as voltage tolerant circuits.

Figure 2:
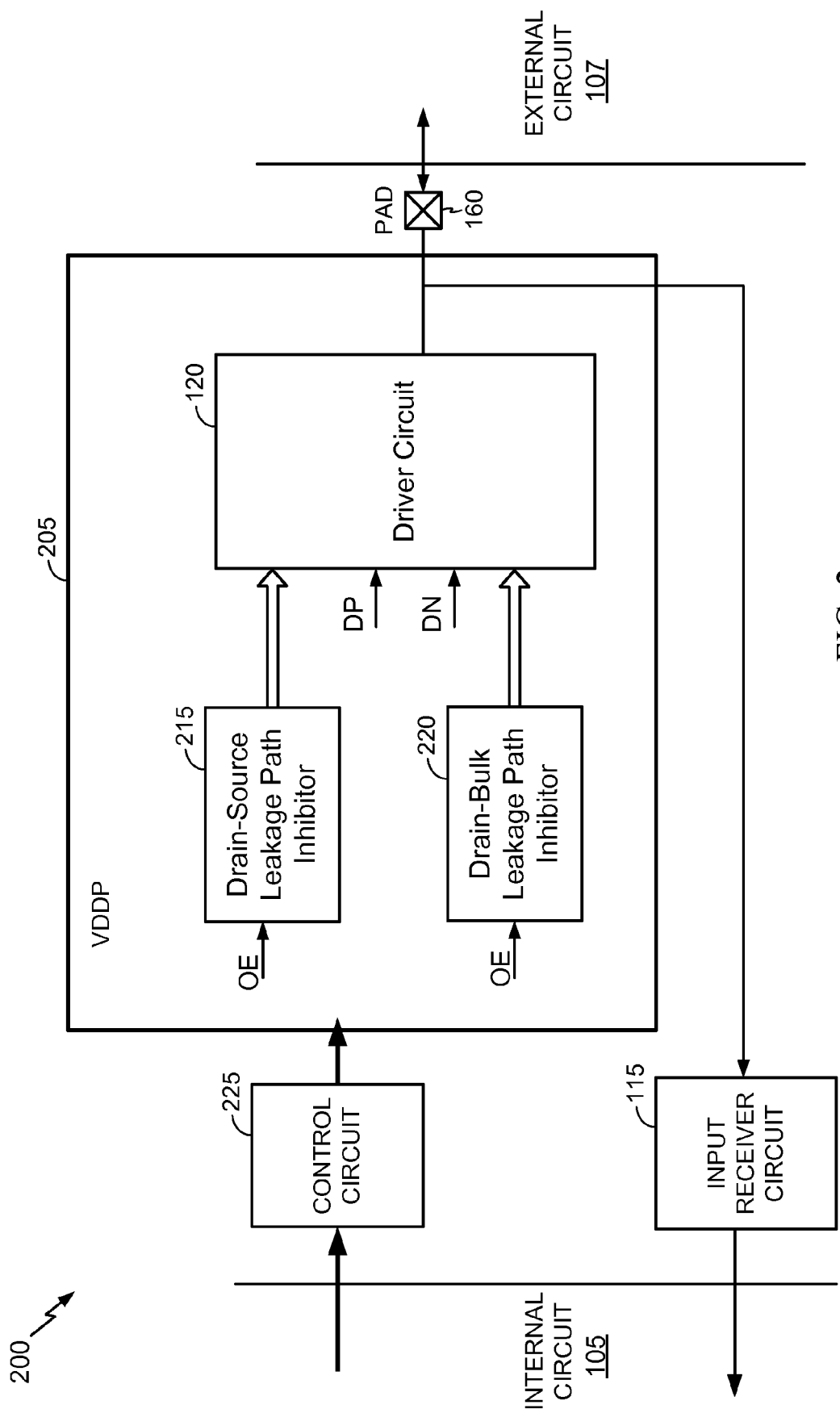
FIG. 2 is a block diagram depicting an exemplary voltage tolerant I/O circuit.

FIG. 2 is a block diagram depicting an exemplary voltage tolerant (VT) I/O circuit 200. The VT I/O circuit 200 includes a control circuit 225, a VT driver circuit 205, and the input receiver circuit 115. The control circuit 225 may take digital information from the internal circuit 105, and as described above, may perform logical operations on the digital information to generate appropriate the control signals DP and DN for use by the VT I/O circuit 205. In addition to these signals, the control circuit 225 may also provide an output enable signal OE which may be used as a separate control signal to indicate whether the VT I/O circuit 205 is in output mode. For example, OE control circuit 205 can set OE at a high voltage level to indicate that VT I/O circuit 205 is in output mode. The input receiver circuit 115 may take signals from the VT I/O circuit 205 which may originate from the external circuit 107. The input receiver 115 may condition these input signals prior to passing them on to the internal circuit 105.

The VT I/O circuit may further include a drain-source leakage path inhibitor 215, a drain-bulk leakage path inhibitor 220, and the driver circuit 120. The driver circuit 120 may be configured as shown in FIG. 1, and may accept control signals DP and DN to properly configure the driver circuit's transistors for both input and output mode operation. The drain-source leakage path inhibitor 215 may be used to mitigate the first type of leakage currents described above. When the OE signal indicates that the VT I/O circuit is in input mode, the drain-source leakage path inhibitor may establish a circuit which can isolate the positive voltage supply 135 from the driver circuit when the input signal voltage exceeds the positive voltage supply's VDDP volts. The drain-source leakage path inhibitor 215 may thus isolate the positive voltage supply from leakage currents passing through the drain-source connection of a p-channel transistor within the driver circuit 120. The drain-bulk leakage path inhibitor 220 may accept the OE signal from the control circuit 225, and when in input mode, serve to mitigate the second type of leakage currents described above in FIG. 1. The drain-bulk leakage path inhibitor 220 may establish a circuit which can isolate leakage currents which may pass through the drain-bulk connection of a p-channel transistor of the driver circuit 120, and entering into the positive voltage supply 135. Additionally, the drain-bulk leakage path inhibitor 220 may also be used to mitigate similar leakage paths of other p-channel transistors within the VT I/O circuit 200, including p-channel transistors within the drain-bulk leakage path inhibitor 220 itself.

Accordingly, an embodiment of the invention can include an apparatus for mitigating leakage currents caused by input signals within a driver circuit. The apparatus may include a means for receiving an input signal voltage (e.g., 160), a means for isolating a voltage supply from leakage currents passing through a drain-source connection of a transistor within a driver circuit (e.g., 120) when an input signal voltage exceeds a supply voltage (e.g., 215), and a means for isolating leakage currents passing through drain-bulk connections of a transistor within a driver circuit (e.g., 120) when the input signal voltage exceeds the supply voltage (e.g., 220).

Figure 3:
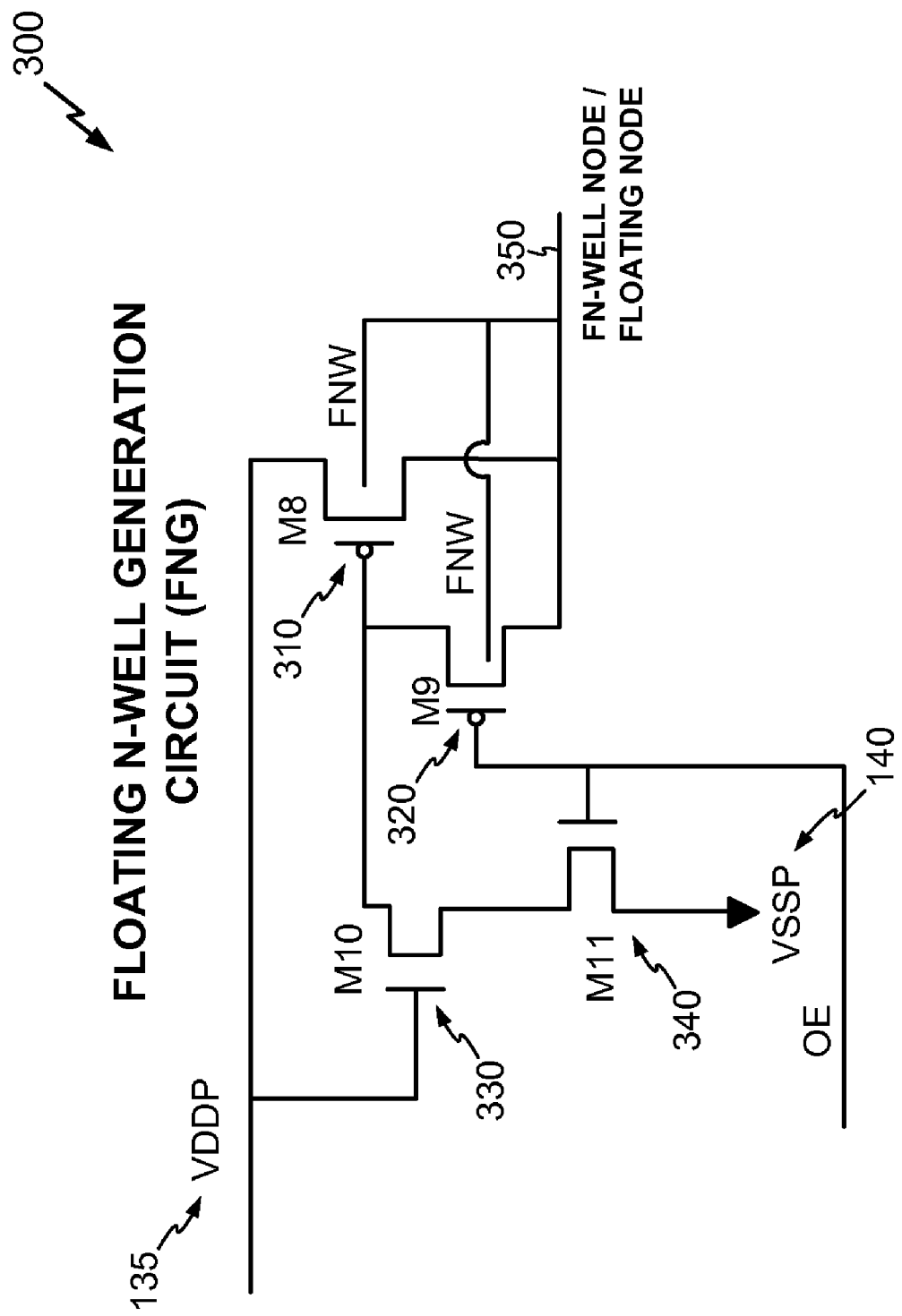
FIG. 3 is a schematic diagram of a Floating N-well generator circuit.

FIG. 3 is a schematic diagram of a Floating N-well Generator circuit (FNG) 300. In various embodiments, the FNG 300 may be used to realize both the drain-source leakage path inhibitor 215 and the drain-bulk leakage path inhibitor 220. When the FNG 300 is used to realize the drain-source leakage path inhibitor 215, its output node 350 may be referred to as a "floating" node. When the FNG 300 is used to realize a drain-bulk leakage path inhibitor 220, its output node 350 may be referred to as a "Floating N-well (FN-well)" node. The FNG 300 may utilize p-channel transistors which are formed using a standard process. The p-channel transistors may utilize bulk nodes which may not be coupled to a fixed voltage and thus may float during various modes of operation. The FN-well node 350 may be configured to be placed in a potential drain-bulk leakage path in order to inhibit the leakage current flow. Conventionally, N-wells may be used as a bulk node for p-channel transistors which may conventionally have their bulk node tied to the positive voltage supply, as shown for the p-channel transistor 125 in the conventional I/O circuit 100 depicted in FIG. 1. A floating N-well may not be tied to the voltage supply, but rather may float at least during some modes of operation. The FNG 300 may provide a floating n-well for the VT I/O circuit 300 during the input mode, and may alternatively pull the n-well up to the positive voltage supply 135 value VDDP during output mode. Details of the structure and operation of the FNG 300 are provided below.

Further referring to FIG. 3, the FNG circuit 300 may include a p-channel transistor 310 having its source node connected to the positive voltage supply 135 and its drain node connected to the FN-well node 350. The p-channel transistor 310 may be controlled by another p-channel transistor 320, and a controlled pull-down path which may include one or more transistors depending upon parameters of the FNG circuit 300. For example, as shown in FIG. 3, the controlled pull-down path may include n-channel transistors 330 and 340. The p-channel transistor 320 may have its source node connected to the gate node of the p-channel transistor 310, its gate node connected to the OE control signal line, and its drain node connected to the FN-well node 350. The bulk nodes of both p-channel transistors 310 and 320 may also be connected to the FN-well node 350. The n-channel transistor 330 may have its gate node connected to the positive voltage supply 135, its drain node connected to both the gate node of p-channel transistor 310 and the source node of p-channel transistor 320. The source node of the n-channel transistor 330 may be connected to the drain node of the n-channel transistor 340. Completing the controlled pull-down path may be an n-channel transistor 340 having its source node connected to the negative voltage supply 140, and its gate node connected to the OE control signal line. The p-channel transistors 310, 320 may be any suitable transistor known in the art, and include pFETs and/or pMOSFETs. Likewise, the n-channel transistors 330, 340 may be any suitable transistor known in the art, and include nFETs and/or nMOSFETs. Also, the positive voltage supply 135 and the negative voltage supply 140 may represent the most positive and most negative voltages within the FNG circuit 300. In some situations, the negative supply may simply be ground potential (i.e., the negative supply may be designated as zero volts).

Further referring to FIG. 3, the operation of the FNG 300 may be described as follows. During output mode, the OE control signal may be set at a high voltage level and can activate the controlled pull-down path (n-channel transistors 330, 340), and places the p-channel transistor 320 in an off state. Activating the controlled pull-down path also presents a low voltage VSSP at the gate of p-channel transistor 310, and turns the transistor on to complete the path between the FN-well node 350 and positive voltage supply 135. Completing this path may pull-up the voltage of the FN-well node 350 to VDDP which is desirable for output mode operation.

During the input mode, the OE control signal may be set at a low voltage level which may turn p-channel transistor 320 on, and may deactivate the n-channel transistor 340 in the controlled pull-down path. At this point, FN-well node 350 may not yet be floating because the p-channel transistor 310 may still be on depending upon the voltage level present at its gate node. If p-channel transistor 310 is on, current from the FN-well node may be leaking into the positive voltage supply 135 through the drain-source connection of p-channel transistor 310. However, because the p-channel transistor 320 is on, current originating from the FN-well node 350 may also flow through the drain-source connection of p-channel transistor 320. This may result in charging up the gate of p-channel transistor 310 to the point where p-channel transistor 310 turns off. Once p-channel transistor 310 turns off, the leakage current going through its drain-source connection is inhibited, thus mitigating the leakage current entering into the positive voltage supply 135. Additionally, because the source node of p-channel transistor 320 may be further charged-up from the current originating from the FN-well node 350, the p-channel transistor 320 may turn off, which will float the FN-well node 350. At this point, the FN-well node 350 may truly be at a floating voltage potential, and may be connected to all of the bulk nodes of the p-channel transistors within both the FNG circuit 300 and the driver circuit 120, which may see a higher voltage than VDDP at one of their terminals. One may note that for the p-channel transistors 310 and 320, this usage may be considered iterative in nature; however this should not be associated with any undesirable positive feedback.

Accordingly an embodiment of the invention may include an apparatus for mitigating leakage currents caused by input voltages. The apparatus may include a first transistor (e.g., 310) having a source line coupled to a positive voltage supply (e.g., 135), and a drain line and bulk line coupled to the FN-well node (e.g., 350). The apparatus may further include a controllable pull-down path (e.g., 330, 340) coupled to a negative voltage supply (e.g., 140) and the first transistor, wherein the controllable pull-down path is configured to turn on the first transistor and pull-up the FN-well node during a first state. The apparatus may further include a second transistor (e.g., 320) having source line coupled to a gate line of the first transistor, and drain line and bulk line coupled to the FN-well node, wherein the second transistor is configured to place the FN-well node at a floating potential during a second state.

Figure 4:
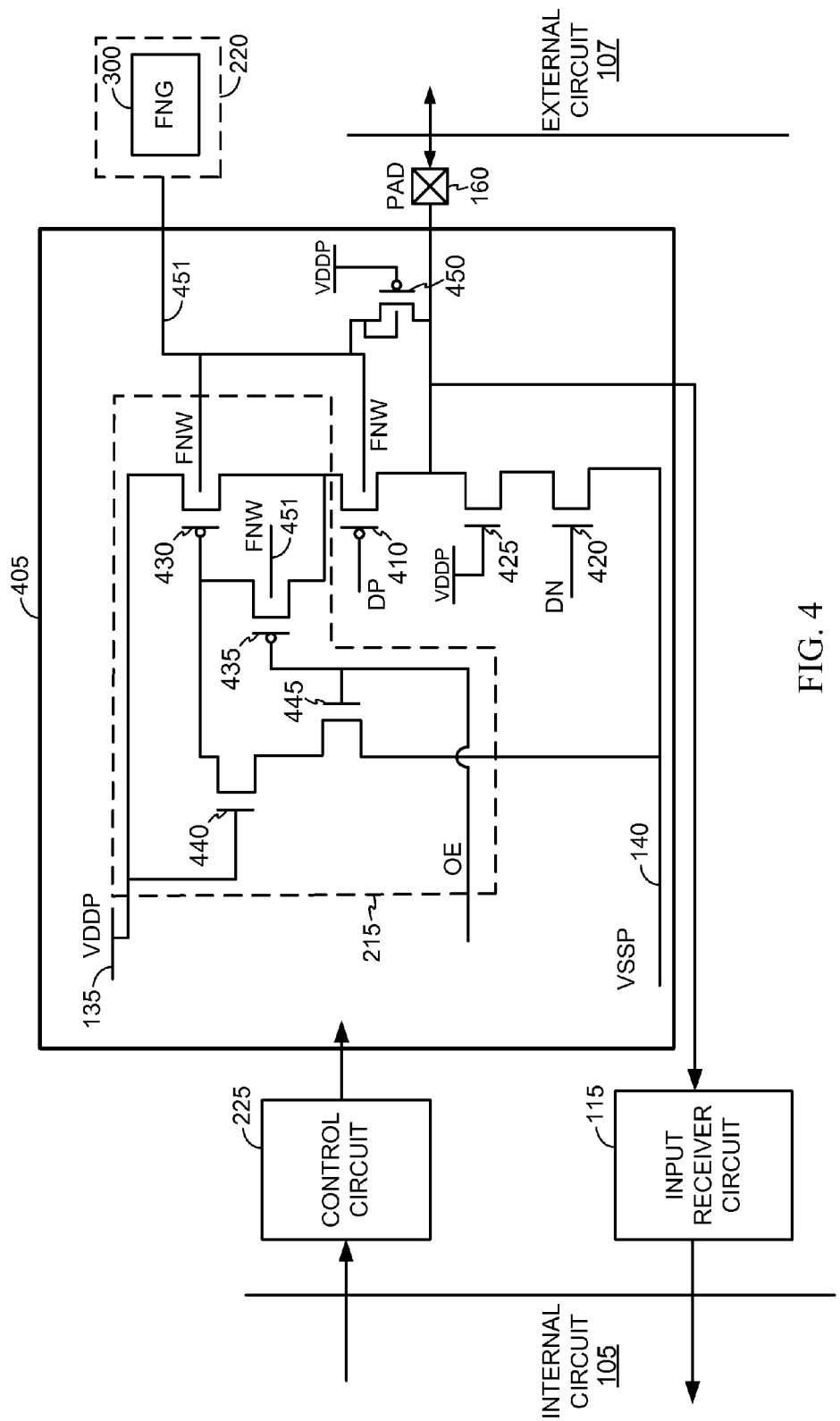
FIG. 4 is a schematic diagram of an exemplary voltage tolerant I/O circuit.

FIG. 4 is a schematic diagram of an embodiment of a voltage tolerant (VT) I/O circuit 400 which utilizes the FNG 300 in both the drain-source leakage path inhibitor 215 and the drain-bulk leakage path inhibitor 220. The VT I/O circuit may include the control circuit 110, the input receiver circuit 115, and a VT driver circuit 405. The description of the control circuit 110 and input receiver circuit 115 are unchanged from the discussed aspects presented above. The VT I/O driver includes the drain-source leakage path inhibitor 215 (outlined in dashed lines) which further may include an FNG circuit 300. The VT I/O driver circuit 405 may also include a drain-bulk leakage inhibitor 220 (also outlined in dashed lines) which may utilize a second FNG circuit 300. The VT I/O driver circuit may interface with the external circuit 107 over the I/O node 160.

A driver circuit within the VT I/O driver 405 may include a p-channel transistor 410 and an n-channel transistor 420 (which may also include an additional transistor 425 to provide additional voltage tolerance). The drain nodes of each of these transistors may be connected to the I/O node 160. The source node of the n-channel transistor 420 may be connected to the negative voltage supply 140, and its gate node may be driven by the DN control signal supplied by the control circuit 110. The gate of the p-channel transistor 410 may be driven by the DP control signal, also supplied by the control circuit 110, and the p-channel transistor's 410 source node may be connected to the drain node of p-channel transistor 435 of the drain-source leakage path inhibitor 215. The bulk node of the p-channel transistor 410 may be connected to the drain-bulk leakage path inhibitor 220.

An embodiment of the invention may further include an additional p-channel transistor 450 having a drain node connected to the I/O node 160, a gate node connected to VDDP 135, and a source and bulk node connected to the FN well node 451. The additional p channel transistor 450 can provide a separate conductive path which may reduce the time it takes for the FN well node to charge up to the voltage of the I/O node 160 when an exceeding voltage input signal is presented by the external circuit 107.

The voltage supplies 135 and 140 may represent the most positive and most negative voltages within the VT I/O circuit 400. However, in some situations, the negative supply 140 may simply be at ground potential. While shown only using two controlled transistors (e.g., 410 and 420), the driver circuit may utilize additional transistors as known in the art. The p-channel transistor 410 may be any suitable p-type transistor known in the art, and may include pFETs and/or pMOSFETs. Likewise, the n-channel transistor 430 may be any suitable n-type transistor known in the art, and include nFETs and/or nMOSFETs.

In the embodiment shown in FIG. 4, the drain source leakage path inhibitor 215 may include a first FNG circuit which may have a p-channel transistor 430 having its source node connected to the positive voltage supply 135 and its drain node connected to the source node of the driver circuit's p-channel transistor 410. The p-channel transistor 430 may be controlled by another p-channel transistor 435, and a controlled pull-down path which may include the n-channel transistors 440 and 445. The p-channel transistor 435 may have its source node connected to the gate node of the p-channel transistor 430, its gate node connected to the OE control signal line, and its drain node connected to the source node of the driver circuit's p-channel transistor 410. The bulk nodes of both p-channel transistors 430 and 435 may be connected to the FN-well node 350 of the drain-bulk leakage path inhibitor 220. The n-channel transistor 440 may have its gate node connected to the positive voltage supply 135, its drain node connected to both the gate node of p-channel transistor 430 and the source node of p-channel transistor 435. The source node of the n-channel transistor 440 may be connected to the drain node of an n-channel transistor 445. The n-channel transistor 445 may complete the pull-down path, and have its source node connected to the negative voltage supply 140, and its gate node connected to the OE control signal line.

Further referring to FIG. 4, the operation of the drain-source leakage path inhibitor 215 within the VT driver circuit 405 may be described as follows. As described above in FIG. 1, when an exceeding voltage input signal is present on the I/O node 160, a drain-source interchange may occur on the driver circuit's p-channel transistor. This may result in a leakage current into the positive voltage supply 135 via the drain-source connection of the p-channel transistor 410. In order to mitigate this leakage, the p-channel transistor 430 is placed into a pull-up path of the driver circuit between p-channel transistor 410 and the positive voltage supply 135. The gate of the p-channel transistor 430 may go through the controlled pull-down path through the n-channel transistors 440 and 445, to negative voltage supply 140. The output enable OE control signal may be high during output mode and low during input mode. During output mode, the gate node of p-channel transistor 430 may be pulled down to VSSP, and during input mode this gate node may be floating. The p-channel transistor 435 may also be controlled by the OE control signal, and this transistor will be turned off during output mode, and on during input mode.

With respect to the pull-up circuit of the p-channel transistor 410, during output mode, the p-channel transistor 435 may be off, and the gate of the p-channel transistor 430 may be pulled down to VSSP through the controlled pull-down path of n-channel transistors 440 and 445. This may turn on p-channel transistor 430. If an output signal to be driven from the I/O node 160 is high, the p-channel transistor 410 also turns on, and the I/O node 160 may be pulled to a high voltage level. During input mode, the controlled pull-down path of n-channel transistors 440 and 445 is off because n-channel transistor 445 is turned off, and therefore the gate node of p-channel transistor 430 may float. The p-channel transistor 435 may turn on and connect the source of the driver's p-channel transistor 410 to the gate of p-channel transistor 430. Now, if the I/O output node 160 is driven high by an exceeding voltage input signal (e.g., 3.3 volts), the p-channel transistor 410 may turn on due to the source/drain interchange effect. If the actual source node of p-channel transistor 410 is at a voltage level where p-channel transistor 430 turns on, the transient leakage current from the I/O node 160 may flow through p-channel transistor 410 and then branch out to flow through both p-channel transistors 430 and 435. The leakage current through p-channel transistor 430 may be the same current from I/O node 160 to the positive voltage supply 135 to be mitigated. The leakage current through p-channel transistor 435 may charge up the gate node on p-channel transistor 430 (e.g., up to 3.3 volts). Also, the high level voltage at the gate node of p-transistor 430 turns this transistor off and mitigates the leakage current flowing through the drain-source connection of transistor 430 into the positive voltage supply 135. At this time, both leakage currents stop flowing and steady state may be reached with no leakage current into voltage supply VDDP 135.

Further referring to FIG. 4, the operation of the drain bulk leakage path inhibitor 220 within the VT driver circuit 405 may be described as follows. As described above, this leakage path may occur when the normally reversed biased diode within a p-channel transistor (not shown in FIG. 4) becomes forward biased and may conduct leakage current into the positive voltage supply 135. This type of leakage may become an issue for each p-channel transistor having a terminal which may see an exceeding voltage within the VT I/O driver 405. These leakage currents may be mitigated by connecting the FN-well node 451 to each bulk node of every p-channel transistor within VT driver circuit 405 (including bulk nodes within the drain-bulk leakage inhibitor itself) which may see a voltage higher than VDDP at one of their terminals due to exceeding voltage input signals. Even though the internal diodes may still become forward biased, a transient leakage current may flow from the pad through the bulk node into the FN well node 451, until the point that the node is fully charged up to the exceeding voltage input signal value (e.g., 3.3 volts). At this point, the current through the diode may be cut off, and thus the second type of leakage may be mitigated.

Accordingly, an embodiment of the invention may include an interface circuit capable of accepting an input voltage exceeding a voltage supply. The interface circuit may include a driver circuit (e.g., 120) having an input/output (I/O) node (e.g., 160) for receiving and transmitting signals, a first leakage path inhibitor (e.g., 215) coupled to a source line of a p-channel transistor (e.g., 410) within the driver circuit; and a second leakage path inhibitor (e.g., 220) coupled to a bulk line of the p-channel transistor within the driver circuit.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus for mitigating leakage currents caused by input voltages, comprising:
   a first transistor having a source coupled to a positive voltage supply, and a drain coupled to a floating node;
   a controllable pull-down path coupled to a negative voltage supply and the first transistor, wherein the controllable pull-down path is configured to turn on the first transistor and pull-up the floating node during a first state;
   a second transistor having a source coupled to a gate of the first transistor, and drain coupled to the floating node, wherein the second transistor is configured to place the floating node at a floating potential during a second state;
   wherein the floating node is coupled to a source of a p-channel transistor within a driver circuit, the p-channel transistor having a gate coupled to the positive voltage supply; and wherein an output enable signal is configured to place the apparatus in the second state to prevent leakage currents from passing through the source of the p-channel transistor and into the positive voltage supply when the driver circuit is configured to receive a voltage signal.

2. The apparatus according to claim 1, wherein the floating node is coupled to an n-well and a bulk of at least one of the first or second transistors.

3. The apparatus according to claim 2, wherein the floating node is coupled to a bulk of the p-channel transistor within a driver circuit, and wherein an output enable signal is configured to place the apparatus in the second state to prevent leakage currents from passing through the bulk of the p-channel transistor and into the positive voltage supply when the driver circuit is configured to receive a voltage signal.

4. The apparatus according to claim 1, wherein the controllable pull-down path further comprises:
a third transistor having a source coupled to a negative voltage supply and a drain coupled to both a gate of the first transistor and the source of the second transistor.

5. The apparatus according to claim 4, wherein the controllable pull-down path further comprises:
a fourth transistor coupled between the drain of the third transistor and the gate of the first transistor and the source of the second transistor, wherein a gate of the fourth transistor is coupled to the positive voltage supply.

6. The apparatus according to claim 4, wherein an output enable signal is provided to the gates of the second and third transistors for selecting between the first state and the second state.

7. An interface circuit capable of accepting an input voltage exceeding a voltage supply, comprising:
a driver circuit having an input/output (I/O) node for receiving and transmitting signals;
a first leakage path inhibitor coupled to a source of a p-channel transistor within the driver circuit; and
a second leakage path inhibitor coupled to a bulk of the p-channel transistor and to a bulk of at least one other p-channel transistor within the driver circuit, wherein the first leakage path inhibitor and the second leakage path inhibitor are configured to receive an output enable signal to indicate whether the I/O node is configured to receive or transmit signals.

8. The interface circuit of claim 7, wherein the first leakage path inhibitor is configured to prevent leakage currents from entering into the voltage supply through a drain-source connection of the p-channel transistor when the driver circuit is receiving the input voltage through the I/O node.

9. The interface circuit of claim 7, wherein the second leakage path inhibitor prevents leakage currents from entering into the voltage supply through a drain-bulk connection of the p-channel transistor when the driver circuit is configured to receive the input voltage through the I/O node.

10. An interface circuit capable of accepting an input voltage exceeding a voltage supply, comprising:
a driver circuit having an input/output (I/O) node for receiving and transmitting signals;
a first leakage path inhibitor coupled to a source of a p-channel transistor within the driver circuit; and
a second leakage path inhibitor coupled to a bulk of the p-channel transistor and to a bulk of at least one other p-channel transistor within the driver circuit, wherein the first leakage path inhibitor is configures to prevent leakage currents from entering into the voltage supply through a drain-source connection of the p-channel transistor when the driver circuit is receiving the input voltage through the I/O node, and wherein the first leakage path inhibitor comprises:
a first transistor coupled to the voltage supply and the source of the p-channel transistor;
a controllable pull-down path coupled to a negative voltage supply and the first transistor, wherein the controllable pull-down path is configured to turn on the first transistor and pull-up the source of the p-channel transistor when the I/O node in an output mode; and
a second transistor coupled to the first transistor and the source of the p-channel transistor, wherein the second transistor is configured to float the source to the input voltage at the I/O node.

11. The interface circuit according to claim 10, wherein the first leakage path inhibitor further comprises:
a source of the first transistor coupled to the voltage supply, and a drain of the first transistor coupled to the source of the p-channel transistor; and
a source of the second transistor coupled to a gate of the first transistor, and a drain of the second transistor coupled to the source of the p-channel transistor.

12. The interface circuit according to claim 10, wherein the first leakage path inhibitor further comprises:
a third transistor having a source coupled to the negative voltage supply, and a drain coupled to both a gate of the first transistor and the source of the second transistor.

13. The interface circuit according to claim 12, wherein the controllable pull-down path further comprises:
a fourth transistor coupled between the drain of the third transistor and the gate of the first transistor and the source of the second transistor, wherein a gate of the fourth transistor is coupled to the voltage supply.

14. An interface circuit capable of accepting an input voltage exceeding a voltage supply, comprising:
a driver circuit having an input/output (I/O) node for receiving and transmitting signals;
a first leakage path inhibitor coupled to a source of a p-channel transistor within the driver circuit; and
a second leakage path inhibitor coupled to a bulk of the p-channel transistor and to a bulk of at least one other p-channel transistor within the driver circuit, wherein the second leakage path inhibitor prevents leakage currents from entering into the voltage supply through a drain-bulk connection of the p-channel transistor when the driver circuit is configured to receive the input voltage through the I/O node, and wherein the second leakage path inhibitor further comprises:
a first transistor coupled to the voltage supply and an FN-well node;
a controllable pull-down path coupled to a negative voltage supply and the first transistor, wherein the controllable pull-down path is configured to turn on the first transistor and pull-up the FN-well node when the I/O node configured for an output mode; and
a second transistor coupled to the first transistor and the FN-well node, wherein the second transistor is configured to place the FN-well node at a floating potential when the I/O node is configured for an input mode.

15. The interface circuit according to claim 14, further comprising:
a source of the first transistor coupled to the voltage supply, and a drain of the first transistor coupled to the FN-well node; and
a source of the second transistor coupled to a gate of the first transistor, and a drain of the second transistor coupled to the FN-well node.

16. The interface circuit according to claim 14, wherein the controllable pull-down path further comprises:
a third transistor having a source coupled to the negative voltage supply, and a drain coupled to both a gate of the first transistor and the source of the second transistor.

17. The interface circuit according to claim 16, wherein the controllable pull-down path further comprises:
a fourth transistor coupled between the drain of the third transistor and the gate of the first transistor and the source of the second transistor, wherein a gate of the fourth transistor coupled to the voltage supply.

18. The interface circuit according to claim 14, wherein the FN-well node is coupled to a bulk of the p-channel transistor within the driver circuit, and further wherein the FN-well node is coupled to bulks of a plurality of p-channel transistors in the first and second leakage path inhibitors.

19. The interface circuit according to claim 14, further comprising:
a third transistor having a drain node connected to the I/O node, a gate node connected to the voltage supply, and a source and bulk node connected to the FN-well node, wherein the third transistor is configured to provide a separate conductive path to reduce the time for the FN-well node to charge up to the input voltage.

20. A method for mitigating leakage currents caused by an input voltage at an input/output (I/O) node that exceeds the supply voltage in an I/O device, the method comprising:
receiving a control signal having a first level corresponding to an input state and a second level corresponding to an output state;
applying the control signal to a first leakage path inhibitor to isolate the voltage supply from leakage currents passing through a drain-source connection of a transistor within the driver circuit; and
applying the control signal to a second leakage path inhibitor to isolate leakage currents passing through the drain-bulk connections of a plurality of transistors in the I/O device, wherein the first leakage path inhibitor and the second leakage path inhibitor are configured to receive an output enable signal to indicate whether the I/O node is configured to receive or transmit signals.

21. An apparatus for mitigating leakage currents in an input/output (I/O) device, comprising:
means for receiving an input voltage;
means for isolating a voltage supply from leakage currents passing through a drain-source connection of a transistor within a driver circuit when the input voltage exceeds a supply voltage; and
means for isolating leakage currents passing through drain-bulk connections of a plurality of transistors within the I/O device when the input voltage exceeds the supply voltage, wherein the means for isolating a voltage supply from leakage currents passing through a drain-source connection of a transistor within a driver circuit and the means for isolating leakage currents passing through drain-bulk connections of a plurality of transistors within the I/O device are configured to receive an output enable signal to indicate whether the I/O node is configured to receive or transmit signals.

* * * * *